United States Patent
Cummings

(10) Patent No.: US 10,644,811 B1
(45) Date of Patent: May 5, 2020

(54) PRIMARY RF INSULATED UNITS INCLUDING SECONDARY RF INSULATED UNITS FOR TESTING MULTIPLE WIRELESS TECHNOLOGIES

(71) Applicant: T-Mobile USA, Inc., Bellevue, WA (US)

(72) Inventor: Oscar Ramses Cummings, Seattle, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 0 days.

(21) Appl. No.: 16/252,065

(22) Filed: Jan. 18, 2019

(51) Int. Cl.
| H04B 17/10 | (2015.01) |
| G01R 29/10 | (2006.01) |
| H04B 17/17 | (2015.01) |
| G01R 31/319 | (2006.01) |
| G01R 29/08 | (2006.01) |

(52) U.S. Cl.
CPC ....... *H04B 17/104* (2015.01); *G01R 29/0821* (2013.01); *G01R 29/105* (2013.01); *G01R 31/31917* (2013.01); *H04B 17/17* (2015.01)

(58) Field of Classification Search
CPC .. H04B 17/104; H04B 17/17; G01R 29/0821; G01R 29/105; G01R 31/31917
See application file for complete search history.

(56) References Cited

U.S. PATENT DOCUMENTS

| 7,167,682 | B1 * | 1/2007 | Madsen | H04B 17/15 |
| | | | | 455/115.1 |
| 9,214,718 | B2 * | 12/2015 | Mow | H01Q 1/243 |
| 2018/0049052 | A1 * | 2/2018 | Doshi | H04W 24/06 |
| 2019/0331718 | A1 * | 10/2019 | Cummings | G01R 29/10 |

* cited by examiner

*Primary Examiner* — Freshteh N Aghdam
(74) *Attorney, Agent, or Firm* — Lee & Hayes, P.C.

(57) ABSTRACT

Architecture and techniques for testing mobile devices within a secondary radio frequency (RF) signal isolation unit with respect to various wireless communication protocols. One or more of the secondary RF signal isolation units is located within a larger, primary RF signal isolation unit. Testing arrangements within the primary RF signal isolation unit may include input panels, switching arrangements, attenuator arrangements and/or output arrangements, in addition to the one or more secondary RF signal isolation units.

16 Claims, 4 Drawing Sheets

PRIMARY RF INSULATED UNITS INCLUDING SECONDARY RF INSULATED UNITS FOR TESTING MULTIPLE WIRELESS TECHNOLOGIES

BACKGROUND

In recent years, mobile telecommunication devices have advanced from offering simple voice calling services within wireless communication networks to providing users with many new features. Mobile telecommunication devices now provide messaging services such as email, text messaging, and instant messaging; data services such as internet browsing; media services such as storing and playing a library of favorite songs; location services; and many others. In addition to the new features provided by the mobile telecommunication devices, users of such mobile telecommunication devices have greatly increased. Such an increase in users is only expected to continue and, in fact, it is expected that there could be a growth rate of twenty times more users in the next few years alone.

Various components within a wireless communication network need to be tested when there are various updates and/or potential "fixes" to problems within the wireless communication network. Thus, testing rooms are generally utilized to test signals among various components within the testing rooms. For example, servers functioning as base stations may provide to the radio station broadcasting instructions to the radio frequency (RF) signals to mobile communication devices, e.g., mobile devices or user equipment. In order to avoid interference and/or cross-contamination with respect to the RF signals being transmitted between base stations and mobile communication devices, the mobile communication devices, and possibly servers functioning as base stations, may be placed within RF signal isolation units in the testing rooms. However, due to the number of servers functioning as base stations and mobile communication devices being tested in a testing rooms, the RF signal isolation units may not be enough to prevent interference and/or cross-contamination of RF signals between servers functioning as base stations and mobile communication devices that are under test.

BRIEF DESCRIPTION OF THE DRAWINGS

The detailed description is set forth with reference to the accompanying figures, in which the left-most digit of a reference number identifies the figure in which the reference number first appears. The use of the same reference numbers in different figures indicates similar or identical items or features.

DETAILED DESCRIPTION

Figure 1:
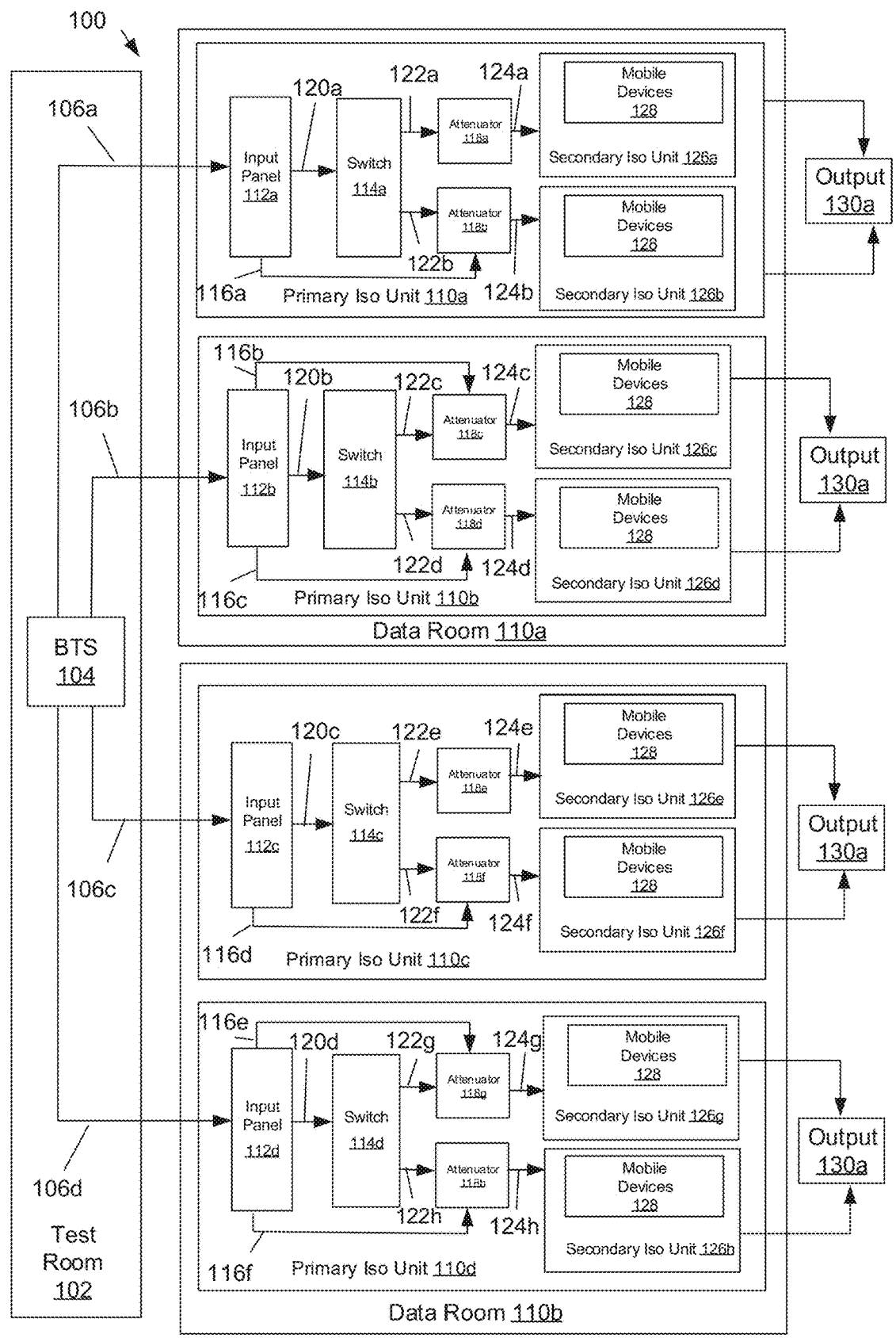
FIG. 1 schematically illustrates an example testing environment, in accordance with various configurations.

Described herein are architecture and techniques for testing mobile communication devices, also referred to herein as user equipment (UEs) or mobile devices, within a secondary radio frequency (RF) signal isolation unit with respect to various wireless communication protocols. One or more of the secondary RF signal isolation units is located within a larger, primary RF signal isolation unit.

For example, a test room operated by an engineer of a wireless communication network may include servers functioning as different types of base stations and/or access points. For example, servers may be operating within the test room and functioning as Base Transceiver Stations (BTSs), e.g., an eNodeB, a NodeB, etc., depending upon the wireless communication protocol. Examples of wireless communication protocols include, but are not limited to, Global System for Mobile Communications GSM, IP Multimedia Subsystem or IP Multimedia Core Network Subsystem (IMS), Time Division Multiple Access (TDMA), Universal Mobile Telecommunications System (UMTS), Evolution-Data Optimized (EVDO), Long Term Evolution (LTE), Fifth Generation (5G), Generic Access Network (GAN), Unlicensed Mobile Access (UMA), Code Division Multiple Access (CDMA) protocols (including IS-95, IS-2000, and IS-856 protocols), Advanced LTE or LTE+, Orthogonal Frequency Division Multiple Access (OFDM), General Packet Radio Service (GPRS), Enhanced Data GSM Environment (EDGE), Advanced Mobile Phone System (AMPS), Wi-Fi protocols (including IEEE 802.11 protocols), WiMAX protocols (including IEEE 802.16e-2005 and IEEE 802.16m protocols), High Speed Packet Access (HSPA) (including High Speed Downlink Packet Access (HSDPA) and High Speed Uplink Packet Access (HSUPA)), Ultra Mobile Broadband (UMB), and/or the like.

The test room may include one or more mobile devices and/or computing devices simulating operation of mobile devices. The mobile devices may comprise any appropriate device, e.g., a stationary device or a portable electronic device, for communicating over a wireless communication network. Examples of such devices include mobile telephones, cellular telephones, internet protocol (IP) telephones, mobile computers, Personal Digital Assistants (PDAs), radio frequency devices, handheld computers, laptop computers, tablet computers, palmtops, pagers, devices configured as IoT devices, IoT sensors that include cameras, integrated devices combining one or more of the preceding devices, and/or the like. As such, the mobile devices may range widely in terms of capabilities and features.

Each of the servers functioning as Base Transceiver Stations (referred to herein as BTSs) may include multiple output ports, for example, up to fifty or more output ports. The output ports may be communicatively coupled to a primary RF isolation unit. Each of the primary RF isolation units may include an input panel. Thus, the input panel may have multiple input ports, e.g., up to fifty or more input ports that may be communicatively coupled with output ports of the BTSs within the test room. In configurations, the primary RF signal isolation units may be located within a data room separate from the test room that includes the BTSs. In other configurations, the BTSs and the primary RF signal isolation units may be located within the same test room. Additionally, in configurations, the input panel may include filters for filtering power sources, USB connectivity, fiber optics, ethernet protocols, ventilation and conditioning, and IP cameras with respect to the RF input signals received from the BTSs. Every source interacting with the BTSs may leak signals through these sources and the filters are critical to provide such isolation.

The primary RF signal isolation units (shielded unit) may further include a switching arrangement communicatively coupled to output ports of the input panel. The switching arrangement may include multiple switches for routing the input signals within the primary RF signal isolation unit. Additionally, the input panel may include multiple fixed output ports that may be communicatively coupled to attenuator arrangements. For example, the input panel may include six fixed output ports that are communicatively coupled to a first attenuator arrangement and the input panel may include six fixed output ports that are coupled to a second attenuator arrangement. In configurations, the input panel may only include fixed output ports that are communicatively coupled to one or the other of the attenuator arrangements.

In configurations where the input panel includes fifty input ports for receiving RF signals from the BTSs, the input panel may include twelve fixed output ports, e.g., six fixed output ports communicatively coupled to a first attenuator arrangement and six fixed output ports communicatively coupled to a second attenuator arrangement, the input panel may include forty output ports communicatively coupled to the switching arrangement. In such a configuration, the switching arrangement may be configured with output ports communicatively coupled to the first attenuator arrangement and output ports communicatively coupled to the second attenuator arrangement, e.g., in an example configuration, twenty output ports communicatively coupled to the first attenuator arrangement and six output ports communicatively coupled to the second attenuator arrangement.

The attenuator arrangements may include output ports communicatively coupled to one or more secondary RF signal isolation units. For example, an arrangement may include two secondary RF signal isolation units. In configurations, each attenuator arrangement may include multiple output ports where the first attenuator arrangement may include output ports that are communicatively coupled to a first secondary RF signal isolation unit while the second attenuator arrangement may include output ports communicatively coupled to a secondary RF signal isolation unit.

Within each secondary RF signal isolation unit, there may be multiple mobile devices included therein. Additionally, or alternatively, each secondary RF signal isolation unit may include computing devices that emulate functionality of mobile devices.

The mobile devices within each secondary RF signal isolation unit may thus receive test RF signals from the corresponding attenuator arrangements. For example, a first attenuator arrangement may include twenty output ports communicatively coupled to a first secondary RF signal isolation unit, while a second attenuator arrangement may include twelve ports communicatively coupled to the second secondary RF signal isolation unit. Such arrangements allow for each secondary RF isolation unit to be dedicated to performing various tests with respect to various wireless communication protocols. For example, the first secondary isolation unit may be configured to receive test signals configured for a LTE wireless telecommunication network, while the second secondary isolation unit may be configured to receive RF signals pertaining to the LTE Inter Radio Access Technology (IRAT) wireless communication protocol. Other wireless communication protocols may be tested within other dedicated secondary RF signal isolation units.

Once the RF signals are properly routed from the appropriate BTSs to the mobile devices within the secondary RF signal isolation units, the mobile devices within the secondary RF signal isolation units may receive the RF input signals and may be monitored and tested with respect to functionality and various other aspects of operation of the mobile devices according to the corresponding wireless communication protocol. One or more output arrangements may be communicatively coupled to the secondary RF signal isolation units to gather and/or analyze test results from the mobile devices within the secondary RF signal isolation units. The output arrangements may be included within the RF signal isolation units or may be external thereto.

FIG. 1 schematically illustrates an example testing environment 100 that includes a Base Transceiver Station (BTS) room 102 that includes one or more servers 104 functioning as BTSs (referred to herein as BTSs), e.g., an eNodeB, a NodeB, etc., depending upon the wireless communication protocol. Examples of wireless communication protocols include, but are not limited to, Global System for Mobile Communications GSM, IP Multimedia Subsystem or IP Multimedia Core Network Subsystem (IMS), Time Division Multiple Access (TDMA), Universal Mobile Telecommunications System (UMTS), Evolution-Data Optimized (EVDO), Long Term Evolution (LTE), Fifth Generation (5G), Generic Access Network (GAN), Unlicensed Mobile Access (UMA), Code Division Multiple Access (CDMA) protocols (including IS-95, IS-2000, and IS-856 protocols), Advanced LTE or LTE+, Orthogonal Frequency Division Multiple Access (OFDM), General Packet Radio Service (GPRS), Enhanced Data GSM Environment (EDGE), Advanced Mobile Phone System (AMPS), Wi-Fi protocols (including IEEE 802.11 protocols), WiMAX protocols (including IEEE 802.16e-2005 and IEEE 802.16m protocols), High Speed Packet Access (HSPA) (including High Speed Downlink Packet Access (HSDPA) and High Speed Uplink Packet Access (HSUPA)), Ultra Mobile Broadband (UMB), and/or the like.

Each of the BTSs 104 may include multiple output ports 106, for example, up to fifty (more or less depending on the configuration of the testing environment 100) output ports 106a-d. The output ports 106a-d may be communicatively coupled to a corresponding primary RF isolation unit 108a-d within a corresponding data room 110a, 110b. In the example configuration of FIG. 1, there are two data rooms 110a, 110b. Each data room 110a, 110b includes two primary isolation units 108a, 108b and 108c, 108d, respectively.

Each of the primary RF isolation units 108a-d may include an input panel 112a-d, respectively. Thus, each input panel 112a-d may have multiple input ports, e.g., up to fifty or more input ports that may be communicatively coupled with the corresponding output ports 106 of the BTSs 104 within the test room 102. In configurations, the primary RF signal isolation units 108a-d may be located within the data rooms 110a, 110b separate from the test room 102 that includes the BTSs 104. In other configurations, the BTSs 104 and the primary RF signal isolation units 108a-d may be located within the same room, e.g., test room 102. Additionally, in configurations, each input panel 112a-d may include filters (not illustrated) for filtering the input RF signals received from the BTSs.

In configuration, each primary RF signal isolation unit 108a-d may further include a switching arrangement 114a-d, respectively, communicatively coupled to output ports of the corresponding input panel 112a-d. Each switching arrangement 114a-d may include multiple switches for routing the RF signals within the primary RF signal isolation units 108a-d. Additionally, in configurations, each input panel 112a-d may include multiple fixed output ports 116 that may be communicatively coupled to attenuator arrangements 118a-h, as may be seen in FIG. 1. For example, the input panels 112b, 112d may each include fixed output ports 116, e.g., six fixed output ports 116, that are communicatively coupled to a corresponding first attenuator arrangement 118c, 118g, respectively, and the input panels 112b, 112d may include fixed output ports 116, e.g., six fixed output ports 116, that are coupled to a second attenuator arrangement 118d, 118h, respectively.

In configurations, the input panels 112a-d may only include fixed output ports 116 that are communicatively coupled to one or the other of the attenuator arrangements 118a-h. For example, as may be seen in the example testing environment 100, input panels 112a, 112c only include fixed out ports 116 that are communicatively coupled to second attenuator arrangements 118b, 118f, respectively.

In configurations, the input panels 112a-d may include output ports 120a-d, respectively, communicatively coupled to corresponding switching arrangements 114a-d, respectively. In example configurations, the input panels 112a-d may each include forty output ports 120a-d. More or less output ports 120a-d may be included depending on the configuration of the testing environment 100 and the number of output ports 120a-d may vary among the input panels 112a-d.

The switching arrangements 114a-d may be configured with output ports 122a-h communicatively coupled to a corresponding first attenuator arrangement 118a, 118c, 118e, 118g and a corresponding second attenuator arrangement 118b, 118d, 118f, 118h. In an example configuration, twenty output ports 122a, 122c, 122e, 122g, may be communicatively coupled to the corresponding first attenuator arrangement 118a, 118c, 118e, 118g and six output ports 122b, 122d, 122f, 122h may be communicatively coupled to the corresponding second attenuator arrangement 118b, 118d, 118f, 118h. More or less output ports 122a-h may be included depending on the configuration of the testing environment 100 and the number of output ports 122a-h may vary among the switching arrangements 114a-d.

The attenuator arrangements 118a-h may include output ports 122a-h, respectively, communicatively coupled to secondary RF signal isolation units 126a-h, respectively. For example, the testing environment 100 may include two secondary RF signal isolation units 126 within each primary RF signal isolation unit 108. In configurations, each attenuator arrangement 118a-h may include multiple output ports 124a-h, where a first attenuator arrangement, e.g., first attenuator arrangement 118a, within a primary RF signal isolation unit, e.g., primary isolation unit 108a, may include output ports, e.g., output ports 124a, that are communicatively coupled to a first secondary RF signal isolation unit, e.g., secondary RF signal isolation unit 126a, while a second attenuator arrangement, e.g., second attenuator arrangement 118b, within a primary RF signal isolation unit, e.g., primary isolation unit 108a, may include output ports, e.g., output ports 124b, that are communicatively coupled to a second secondary RF signal isolation unit, e.g., secondary RF signal isolation unit 126b.

Within each secondary RF signal isolation unit 126a-126h, there may be multiple mobile devices 128 included therein. Additionally, or alternatively, each secondary RF signal isolation unit may include computing devices (not illustrated) that emulate functionality of mobile devices. The mobile devices may comprise any appropriate device, e.g., a stationary device or a portable electronic device, for communicating over a wireless communication network. Examples of such devices include, but are not limited to, mobile telephones, smart phones, cellular telephones, internet protocol (IP) telephones, mobile computers, Personal Digital Assistants (PDAs), radio frequency devices, handheld computers, laptop computers, tablet computers, palmtops, pagers, devices configured as IoT devices, IoT sensors that include cameras, integrated devices combining one or more of the preceding devices, and/or the like. As such, the mobile devices may range widely in terms of capabilities and features.

The mobile devices 128 within each secondary RF signal isolation unit 126a-h may thus receive test RF signals from the corresponding attenuator arrangements 118a-h. For example, a first attenuator arrangement, e.g., attenuator arrangement 118a, may include twenty output ports 124 communicatively coupled to a first secondary RF signal isolation unit, e.g., secondary RF signal isolation unit 126a, while a second attenuator arrangement, e.g., attenuator arrangement 118b, may include twelve output ports 124 communicatively coupled to a second secondary RF signal isolation unit, e.g., secondary RF signal isolation unit 118b. Such arrangements allow for each secondary RF isolation unit to be dedicated to performing various tests with respect to various wireless communication protocols. For example, the first secondary isolation unit 118a may be configured to receive test signals configured for a LTE wireless telecommunication network, while the second secondary isolation unit 126b may be configured to receive RF signals pertaining to WCDMA/GSM wireless communication protocol. Other wireless communication protocols may be tested within other dedicated secondary RF signal isolation units.

Once the RF signals are properly routed from the appropriate BTSs 104 to the mobile devices 128 within the secondary RF signal isolation units 126a-h, the mobile devices 128 within the secondary RF signal isolation units 126a-h may receive the RF input signals and may be monitored and tested with respect to functionality and various other aspects of operation of the mobile devices 128 according to the corresponding wireless communication protocol. One or more output arrangements 130a-h may be communicatively coupled to the secondary RF signal isolation units 126a-h to perform, gather and/or analyze test results from the mobile devices 128 within the secondary RF signal isolation units 126a-h. The output arrangements 130a-h may be included within the RF signal isolation units 126a-h, within the data room 110a, 110b, or may be external thereto. Additionally, in configurations, the output arrangements 130a-d and the input panels 112a-d may be integrated into single arrangements that serve as control arrangements for testing arrangements within the primary RF signal isolation units 108. In configurations, there may only be a single output arrangement 130 for the testing environment 100.

Figure 2:
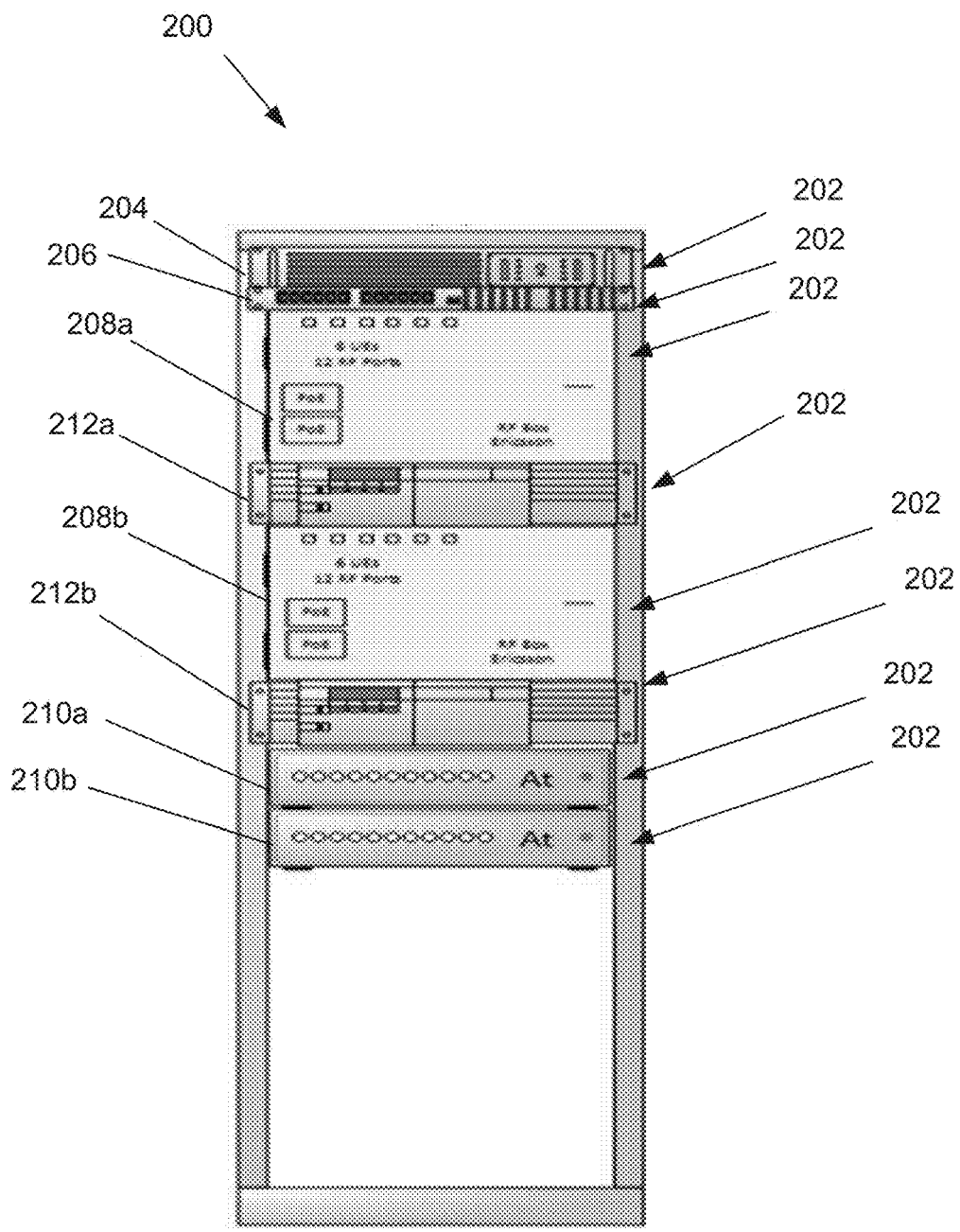
FIG. 2 schematically illustrates an example arrangement of a primary RF signal isolation unit for the example testing environment of FIG. 1, in accordance with various configurations.

FIG. 2 schematically illustrates an example arrangement of a primary RF signal isolation unit 200, e.g., one of primary RF signal isolation units 108a-d. As may be seen, the primary RF signal isolation unit 200 is in the form of a vertical "server-type" cabinet that includes multiple slots 202 for receiving components. The primary RF signal isolation unit 200 includes an input panel 204, e.g., one of input panels 112a-d, and a switching arrangement 206, e.g., one of switching arrangements 114a-d. A first secondary RF signal isolation unit 208a, e.g., one of secondary RF signal isolation units 126a-h, is included along with a second secondary RF signal isolation unit 208b, e.g., one of secondary RF signal isolation units 126a-h. First and second attenuator arrangements 210a, 210b, e.g., two of attenuator arrangements 118a-h, are also included. Finally, first and second output arrangements 212a, 212b, e.g., two of output arrangements 130a-h, are also included. More or fewer of each component 204-212 may be included depending on the configuration of the primary RF signal isolation unit 200.

Figure 3:
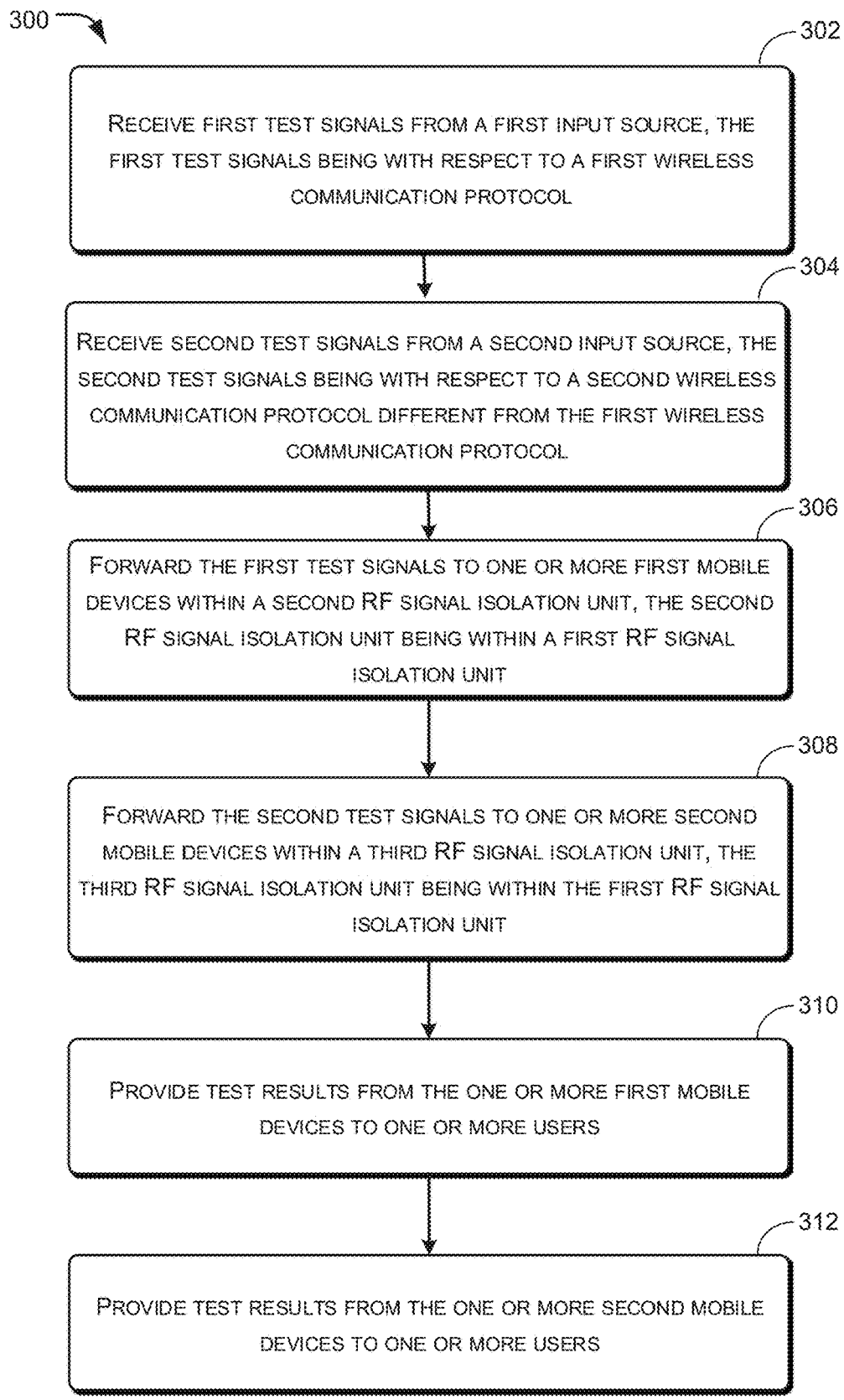
FIG. 3 is a flowchart illustrating a method of determining a location of a small cell access point in the wireless communication network of FIG. 1, in accordance with various configurations.

FIG. 3 is a flow diagram of an illustrative process that may be implemented within or in association with the testing environment 100. This process (as well as other processes described throughout) is illustrated as a logical flow graph, each operation of which represents a sequence of operations that can be implemented in hardware, software, or a combination thereof. In the context of software, the operations represent computer-executable instructions stored on one or more tangible computer-readable storage media that, when executed by one or more processor(s), perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the process. Furthermore, while the architectures and techniques described herein have been described with respect to wireless networks, the architectures and techniques are equally applicable to processor(s) and processing cores in other environments and computing devices.

FIG. 3 is a flow diagram illustrating an example method 300 of testing mobile devices, e.g., mobile devices 128, within a first radio frequency (RF) signal isolation unit, e.g., RF signal isolation unit 126, with respect to various wireless communication protocols. As illustrated, at block 302, first test signals are received from a first input source, the first test signals being with respect to a first wireless communication protocol. In configurations, the first test signals are received by a control arrangement, e.g., input panel 112, within a first RF signal isolation unit, e.g., primary RF signal isolation unit 108. At block 304, second test signals are received from a second input source, the second test signals being with respect to a second wireless communication protocol different from the first wireless communication protocol. In configurations, the second test signals are received by the control arrangement within the first RF signal isolation unit.

At block 306, the first test signals are forwarded by the control arrangement to one or more first mobile devices, e.g., mobile devices 128, within a second RF signal isolation unit, e.g., a secondary RF signal isolation unit 126. In configurations, the second RF signal isolation unit is located within the first RF signal isolation unit. At block 308, the second test signals are forwarded by the control arrangement to one or more second mobile devices within a third RF signal isolation unit, e.g., another secondary RF signal isolation unit 126. In configurations, the third RF signal isolation unit is located within the first RF signal isolation unit.

At block 310, test results from the one or more first mobile devices are provided by the control arrangement to one or more users. At block 312, test results from the one or more first mobile devices are provided by the control arrangement to one or more users.

Thus, testing of mobile devices is performed within secondary RF signal isolation units that are located within primary RF signal isolation units. This minimizes, and even eliminates, interference and/or cross-contamination of RF signals between servers functioning as BTSs and mobile devices that are under test.

Figure 4:
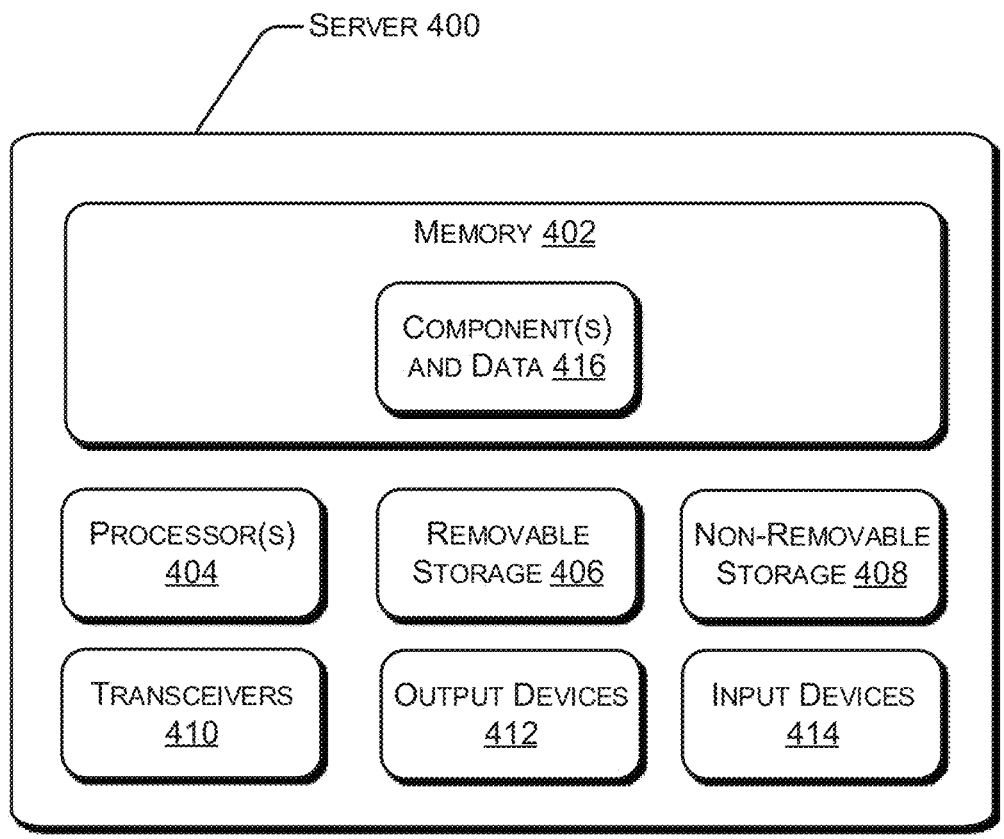
FIG. 4 schematically illustrates a component level view of a server configured for use in the testing environment of FIG. 1 to provide various services of the testing environment of FIG. 1, in accordance with various configurations.

FIG. 4 illustrates a component level view of a server 400 configured for use within a testing environment, e.g., testing environment 100, in order to provide various functionality within the testing environment, according to the techniques described herein. For example, the server 400 may implement the servers 104, e.g., one or more servers 400 may be configured to function as BTSs. Additionally, the server 400 may represent the output arrangements 130a-h or a single output arrangement or control arrangement.

As illustrated, the server 400 comprises a system memory 402 that may store data and one or more components and/or data 416 for interacting with mobile devices 400, e.g., mobile devices 104, as described herein. Also, the server 400 includes processor(s) 404, a removable storage 406, a non-removable storage 408, transceivers 410, output device(s) 412, and input device(s) 414.

In various implementations, system memory 402 is volatile (such as RAM), non-volatile (such as ROM, flash memory, etc.) or some combination of the two. In some implementations, the processor(s) 404 is a Central Processing Unit (CPU), a Graphics Processing Unit (GPU), or both CPU and GPU, or any other sort of processing unit.

The server 400 may also include additional data storage devices (removable and/or non-removable) such as, for example, magnetic disks, optical disks, or tape. Such additional storage is illustrated in FIG. 4 by removable storage 406 and non-removable storage 408. The one or more of the memory 402, the removable storage 406 and/or the non-removable storage 408 may include module(s) and data 416 (illustrated in the memory 402). The module(s) and data 416 may include instructions executable by, for example, the processor(s) 404.

Non-transitory computer-readable media may include volatile and nonvolatile, removable and non-removable tangible, physical media implemented in technology for storage of information, such as computer readable instructions, data structures, program modules, or other data. System memory 402, removable storage 406 and non-removable storage 408 are all examples of non-transitory computer-readable media. Non-transitory computer-readable media include, but are not limited to, RAM, ROM, EEPROM, flash memory or other memory technology, CD-ROM, Digital Versatile Disks (DVD) or other optical storage, magnetic cassettes, magnetic tape, magnetic disk storage or other magnetic storage devices, or any other tangible, physical medium which can be used to store the desired information and which can be accessed by the server 400. Any such non-transitory computer-readable media may be part of the server 400.

In some implementations, the transceivers 410 include any sort of transceivers known in the art. For example, the transceivers 410 may include wired communication components, such as an Ethernet port, for communicating with other networked devices. Also, or instead, the transceivers 410 may include wireless modem(s) to facilitate wireless connectivity with other computing devices. Further, the transceivers 410 may include a radio transceiver that performs the function of transmitting and receiving radio frequency communications via an antenna.

In some implementations, the output devices 412 include any sort of output devices known in the art, such as a display (e.g., a liquid crystal display), speakers, a vibrating mechanism, or a tactile feedback mechanism. Output devices 412 also include ports for one or more peripheral devices, such as headphones, peripheral speakers, or a peripheral display.

In various implementations, input devices 414 include any sort of input devices known in the art. For example, input devices 414 may include a camera, a microphone, a keyboard/keypad, or a touch-sensitive display. A keyboard/keypad may be a push button numeric dialing pad (such as on a typical telecommunication device), a multi-key keyboard (such as a conventional QWERTY keyboard), or one or more other types of keys or buttons, and may also include a joystick-like controller and/or designated navigation buttons, or the like.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

I claim:

1. A system comprising a testing arrangement, the testing arrangement comprising:
   a first Radio Frequency (RF) signal isolation unit;
   a second RF signal isolation unit within the first RF signal isolation unit, the second RF signal isolation unit configured to test first one or more mobile devices within the second RF signal isolation unit with respect to a first wireless communication protocol;
   a third RF signal isolation unit within the first RF signal isolation unit, the third RF signal isolation unit configured to test second one or more mobile devices within the third RF signal isolation unit with respect to a second wireless communication protocol different from the first wireless communication protocol; and
   a control arrangement within the first RF signal isolation unit, the control arrangement configured to (i) route test signals from a first input source to the first one or more mobile devices within the second RF signal isolation unit, (ii) route test signals from a second input source to the second one or more mobile devices within the third RF signal isolation unit, and (iii) provide test results to a user of the system,
   wherein the control arrangement comprises a switching arrangement configured to route the test signals to one of either the second RF signal isolation unit or the third RF signal isolation unit.

2. The system of claim 1, wherein the system comprises multiple testing arrangements.

3. The system of claim 1, wherein the control arrangement comprises an input panel that includes one or more filters.

4. The system of claim 3, wherein the control arrangement further comprises:
   a first attenuator coupled to the switching arrangement and the second RF signal isolation unit; and
   a second attenuator coupled to the switching arrangement and the third RF signal isolation unit.

5. The system of claim 4, wherein at least one of the first attenuator and the second attenuator includes ports directly coupled to the input panel.

6. The system of claim 5, wherein both the first attenuator and the second attenuator include ports directly coupled to the input panel.

7. The system of claim 1, wherein:
   the first input source comprises a base station configured to transmit RF signals in accordance with the first wireless communication protocol; and
   the second input source comprises a base station configured to transmit RF signals in accordance with the second wireless communication protocol.

8. The system of claim 7, wherein:
   the first wireless communication protocol is in accordance with one of Long Term Evolution (LTE), Wideband Code Division Multiple Access (WCDMA), Global System for Mobile Communications (GSM), and Fifth Generation (5G); and
   the second wireless communication protocol is in accordance with one of Long Term Evolution (LTE), Wideband Code Division Multiple Access (WCDMA), Global System for Mobile Communications (GSM), and Fifth Generation (5G).

9. A method comprising:
   routing, by a control arrangement within a first Radio Frequency (RF) signal isolation unit of a testing arrangement, test signals from a first input source to one or more mobile devices within a second RF signal isolation unit, the second RF signal isolation unit being within the first RF signal isolation unit and being configured to test mobile devices within the second RF signal isolation unit with respect to a first wireless communication protocol;
   routing, by the control arrangement, test signals from a second input source to one or more mobile devices within a third RF signal isolation unit, the third RF signal isolation unit being within the first RF signal isolation unit and being configured to test mobile devices within the third RF signal isolation unit with respect to a second wireless communication protocol different from the first wireless communication protocol; and
   providing, by the control arrangement, test results to a user of the testing arrangement,
   wherein the control arrangement comprises a switching arrangement configured to route the test signals to one of either the second RF signal isolation unit or the third RF signal isolation unit.

10. The method of claim 9, wherein the testing arrangement comprises multiple testing arrangements.

11. The method of claim 9, wherein the control arrangement comprises an input panel that includes one or more filters.

12. The method of claim 11, wherein the control arrangement further comprises a first attenuator coupled to the switching arrangement and the second RF signal isolation unit and a second attenuator coupled to the switching arrangement and the third RF signal isolation unit.

13. The method of claim 12, wherein at least one of the first attenuator and the second attenuator includes ports directly coupled to the input panel.

14. The method of claim 13, wherein both the first attenuator and the second attenuator include ports directly coupled to the input panel.

15. The method of claim 9, further comprising:
   transmitting, by the first input source, RF signals in accordance with the first wireless communication protocol, wherein the first input source comprises a base station; and
   transmitting, by the second input source, RF signals in accordance with the second wireless communication protocol, wherein the second input source comprises a base station.

16. The method of claim 15, wherein:
   the first wireless communication protocol is in accordance with one of Long Term Evolution (LTE), Wideband Code Division Multiple Access (WCDMA), Global System for Mobile Communications (GSM), and Fifth Generation (5G); and
   the second wireless communication protocol is in accordance with one of Long Term Evolution (LTE), Wideband Code Division Multiple Access (WCDMA), Global System for Mobile Communications (GSM), and Fifth Generation (5G).

* * * * *